United States Patent
Morosawa et al.

(10) Patent No.: US 8,461,594 B2
(45) Date of Patent: Jun. 11, 2013

(54) THIN FILM TRANSISTOR AND DISPLAY DEVICE

(75) Inventors: Narihiro Morosawa, Kanagawa (JP);
Yasuhiro Terai, Kanagawa (JP);
Toshiaki Arai, Kanagawa (JP)

(73) Assignee: Sony Corporation, Tokyo (JP)

( * ) Notice: Subject to any disclaimer, the term of this patent is extended or adjusted under 35 U.S.C. 154(b) by 143 days.

(21) Appl. No.: 13/122,307

(22) PCT Filed: Oct. 7, 2009

(86) PCT No.: PCT/JP2009/067492
§ 371 (c)(1),
(2), (4) Date: Apr. 1, 2011

(87) PCT Pub. No.: WO2010/041686
PCT Pub. Date: Apr. 15, 2010

(65) Prior Publication Data
US 2011/0180802 A1      Jul. 28, 2011

(30) Foreign Application Priority Data

Oct. 8, 2008 (JP) ................... 2008-261831
Apr. 27, 2009 (JP) ................... 2009-107732

(51) Int. Cl.
*H01L 29/04*     (2006.01)
(52) U.S. Cl.
USPC ............... 257/59; 257/72; 257/43; 257/410; 257/637; 257/646; 257/E29.299

(58) Field of Classification Search
USPC ......... 257/59, 72, 43, 410, 637, 646, E29.299
See application file for complete search history.

(56) References Cited

U.S. PATENT DOCUMENTS

2006/0244107 A1   11/2006   Sugihara et al.
2007/0072439 A1 *  3/2007   Akimoto et al. ............. 438/795

FOREIGN PATENT DOCUMENTS

JP   2005-033172   2/2005
JP   3913756       2/2007

* cited by examiner

*Primary Examiner* — Tu-Tu Ho
(74) *Attorney, Agent, or Firm* — Dentons US LLP

(57) ABSTRACT

Provided are a thin film transistor that is capable of suppressing desorption of oxygen and others from an oxide semiconductor layer, and reducing the time to be taken for film formation, and a display device provided therewith. A gate insulation film 22, a channel protection layer 24, and a passivation film 26 are each in the laminate configuration including a first layer 31 made of aluminum oxide, and a second layer 32 made of an insulation material including silicon (Si). The first and second layers 31 and 32 are disposed one on the other so that the first layer 31 comes on the side of an oxide semiconductor layer 23. The oxide semiconductor layer 23 is sandwiched on both sides by the first layers 31 made of aluminum oxide, thereby suppressing desorption of oxygen and others, and stabilizing the electrical characteristics of a TFT 20. Moreover, since the second layer 32 is made of an insulation material including silicon (Si), the time to be taken for film formation can be reduced compared with a single layer made of aluminum oxide.

13 Claims, 14 Drawing Sheets

THIN FILM TRANSISTOR AND DISPLAY DEVICE

TECHNICAL FIELD

The present invention relates to a thin film transistor (TFT) including an oxide semiconductor layer as a channel, and a display device provided therewith.

BACKGROUND ART

An oxide semiconductor such as zinc oxide or indium gallium zinc oxide (IGZO) has the excellent characteristics to serve as an active layer of a semiconductor device, and recently is under development with the aim of application to a TFT, a light-emitting device, a transparent conductive film, and others.

For example, a TFT using an oxide semiconductor is with a high electron mobility and with excellent electrical characteristics compared with the one in which a channel is amorphous silicon (a-Si: H) previously used in a liquid crystal display device. Such a TFT also has advantages of possibly achieving a high mobility even at a low temperature of about room temperature.

On the other hand, the oxide semiconductor is known to be not heat resistant enough, and to cause lattice defects due to the desorption of oxygen, zinc, and others during a heat treatment in a TFT manufacturing process. Such lattice defects reduce the resistance of the oxide semiconductor layer because, electrically, the impurity level becomes low therewith. Therefore, the resulting operation is performed in the normally-ON mode, i.e., in the depletion mode, in which a flow of drain current is provided even with no application of a gate voltage. As a result, with the increase of the defect level, the threshold voltage is reduced, thereby increasing a leakage current.

Previously proposed is to lower the defect level on an interface by configuring, using amorphous aluminum oxide ($Al_2O_3$), a gate insulation layer that comes in contact with a channel layer being an oxide semiconductor, for example (as an example, refer to Patent Literature 1.)

Citation List

Patent Literature

Patent Literature 1: Specification of U.S. Pat. No. 3,913,756

Non-Patent Literature

Non-Patent Literature 1: Cetin Kilic, and 1 other, n-type doping of oxides by hydrogen, "Applied Physics Letters", 2002, Volume #81, issue No. 1, p. 73 to p. 75.

SUMMARY OF INVENTION

With the configuration described in Patent Literature 1, however, the gate insulation layer has the thickness of 100 nm or more, and more preferably, 200 nm or more because the aluminum oxide is with a slow film formation rate, for forming such a thick layer of aluminum oxide, the time to be taken for film formation has been long.

Moreover, other than the lattice defects caused due to the desorption of oxygen, hydrogen is reported as an element that lowers the impurity level in the oxide semiconductor (as an example, refer to Non-Patent Literature 1.). In other words, if the oxide semiconductor is exposed to the air, the hydrogen in the air reduces the oxygen in the oxide semiconductor. As measures taken thereagainst, previously, the TFT is formed thereon with a passivation film (protection film) made of silicon oxide, silicon nitride, or others not to pass therethrough the hydrogen that much. However, such a previous passivation film is not yet considered enough in view of protection, and there thus has been a demand for the development of a passivation film having the enhanced capabilities of being able to serve as a barrier against the oxygen and hydrogen.

The invention is proposed in consideration of such problems, and a first object thereof is to provide a thin film transistor that is capable of suppressing desorption of oxygen and others from an oxide semiconductor layer, and reducing the time to be taken for film formation, and to provide a display device provided therewith.

A second object of the invention is to provide a thin film transistor that is capable of suppressing reduction of oxygen in an oxide semiconductor that is caused by hydrogen in the air, and suppressing desorption of oxygen and others from an oxide semiconductor layer, and to provide a display device provided therewith.

A first thin film transistor in an embodiment of the invention is provided with a gate insulation film between a gate electrode and an oxide semiconductor layer. On the side of the gate electrode of the oxide semiconductor layer, and on the side opposite to the gate electrode, a laminated film is provided. The laminated film includes a first layer made of aluminum oxide, and a second later made of an insulation material including silicon (Si).

A second thin film transistor in an embodiment of the invention is provided, in order on a substrate, a gate electrode, a gate insulation film, an oxide semiconductor layer, a channel protection film, a source/drain electrode, and a passivation film. The passivation film is made of an oxide, nitride, or oxynitride containing one or more of aluminum (Al), titanium (Ti), and tantalum (Ta).

A first display device in an embodiment of the invention is provided with a thin film transistor and a display element. The thin film transistor therein is configured by the first thin film transistor of the invention described above.

A second display device in an embodiment of the invention is provided with a thin film transistor and a display element. The thin film transistor therein is configured by the second thin film transistor of the invention described above.

In the first thin film transistor in the embodiment of the invention, a laminated film is provided on the side of the gate electrode of the oxide semiconductor layer, and on the side opposite to the gate electrode. The laminated film includes the first layer made of aluminum oxide, and the second later made of an insulation material including silicon (Si). Accordingly, in the resulting configuration, the oxide semiconductor layer is sandwiched on both sides by the first layer made of aluminum oxide. This thus suppresses the desorption of oxygen and others from the oxide semiconductor layer, thereby stabilizing the electrical characteristics. Moreover, since the second layer is made of an insulation material including silicon (Si), the time to be taken for film formation can be reduced compared with a previous gate insulation layer configured by a single layer of aluminum oxide.

In the second thin film transistor in the embodiment of the invention, the passivation film is made of an oxide, nitride, or oxynitride containing one or more of aluminum (Al), titanium (Ti), and tantalum (Ta). Such a configuration suppresses hydrogen from reaching the oxide semiconductor layer so that the reduction of oxygen due to the hydrogen in the air does not occur in the oxide semiconductor layer. Moreover, the desorption of oxygen and others does not occur either in the oxide semiconductor layer so that the threshold voltage is stabilized in the resulting thin film transistor, and an off current is suppressed from increasing.

According to the first thin film transistor in the embodiment of the invention, on the side of the gate electrode of the oxide semiconductor layer, and on the side opposite to the gate electrode, provided is the laminated film including the first layer made of aluminum oxide, and the second later made of an insulation material including silicon (Si). Accordingly, in the resulting configuration, the oxide semiconductor layer can be sandwiched on both sides by the first layer made of aluminum oxide. This thus suppresses the desorption of oxygen and others from the oxide semiconductor layer, thereby stabilizing the electrical characteristics. Moreover, since the second layer is made of an insulation material including silicon (Si), the time to be taken for film formation can be reduced compared with a previous gate insulation layer configured by a single layer of aluminum oxide.

In the second thin film transistor in the embodiment of the invention, the passivation film is made of an oxide, nitride, or oxynitride containing one or more of aluminum (Al), titanium (Ti), and tantalum (Ta). Such a configuration can suppress the reduction of oxygen in the oxide semiconductor layer that is caused by the hydrogen in the air, and also can suppress the desorption of oxygen and others in the oxide semiconductor layer.

DESCRIPTION OF EMBODIMENTS

In the below, by referring to the accompanying drawings, embodiments of the invention are described in detail. Note that the description is given in the following order.

1. First Embodiment (an example in which a gate insulation film, a channel protection layer, and a passivation film are each a laminated film in a first thin film transistor)

2. Second Embodiment (an example with a single-layer passivation film in a second thin film transistor)

3. Third Embodiment (an example with a laminated passivation film in the second thin film transistor)

4. Modified Example 1 (an example in which a gate insulation film and a channel protection layer are each a laminated film in the first thin film transistor)

5. Modified Example 2 (an example in which a gate insulation film and a passivation film are each a laminated film in the first thin film transistor)

(First Embodiment)

Figure 1:
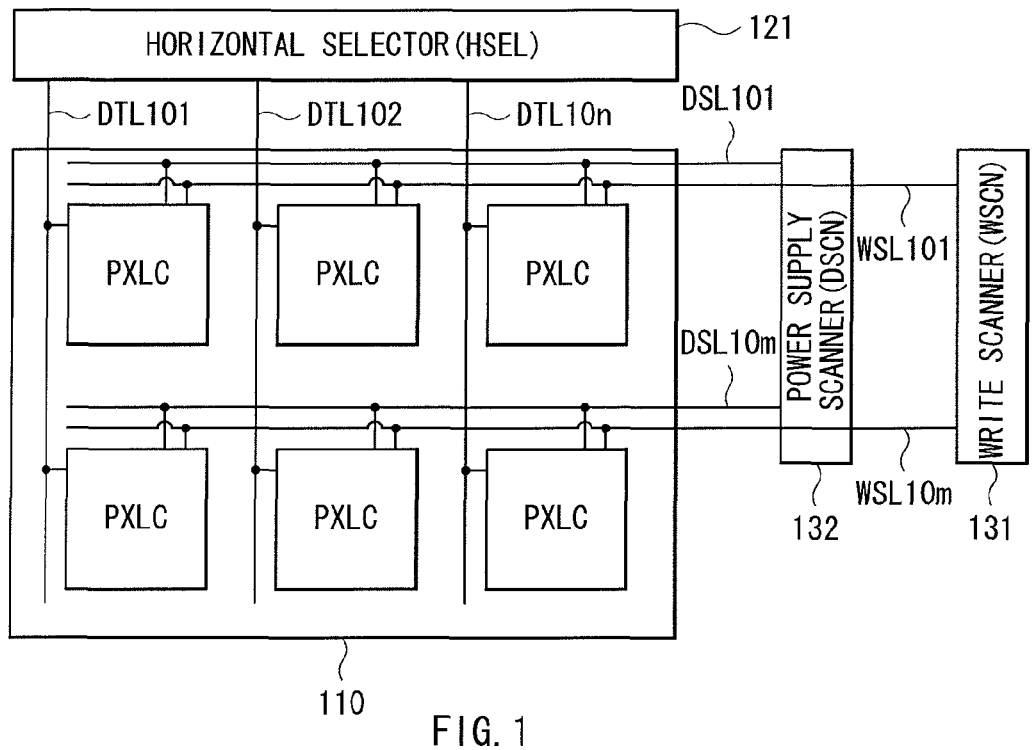
FIG. 1 A view of a display device in an embodiment of the invention, showing the configuration thereof.

FIG. 1 is a diagram showing the configuration of a display device in a first embodiment of the invention. This display device is for use as an ultra-thin organic light-emitting color display device. For example, in this display device, a TFT substrate 1 that will be described later is provided thereon with a display region 110, in which pixels PXLC are arranged in a matrix. The pixels PXLC are each configured by any one of a plurality of organic light-emitting elements 10R, 10G, and 10B each being a display element and will be described later. This display region 110 is provided therearound with a horizontal selector (HSEL) 121 being a signal section, a write scanner (WSCN) 131 and a power supply scanner (DSCN) 132 each being a scanner section.

In the display region 110, signal lines DTL 101 to 10$n$ are arranged in a column direction, and in a row direction, scan lines WSL 101 to 10$m$ and power supply lines DSL 101 to 10$m$ are arranged. At each intersection between the signal lines DTL and the scan lines WSL, provided is a pixel circuit 140 including the organic light-emitting element PXLC (any one of 10R, 10G, and 10B (sub pixel)). The signal lines DTL are each connected to the horizontal selector 121, and from this horizontal selector 121, the signal lines DTL are each provided with a video signal. The scan lines WSL are each connected to the write scanner 131. The power supply lines DSL are each connected to the power supply line scanner 132.

Figure 2:
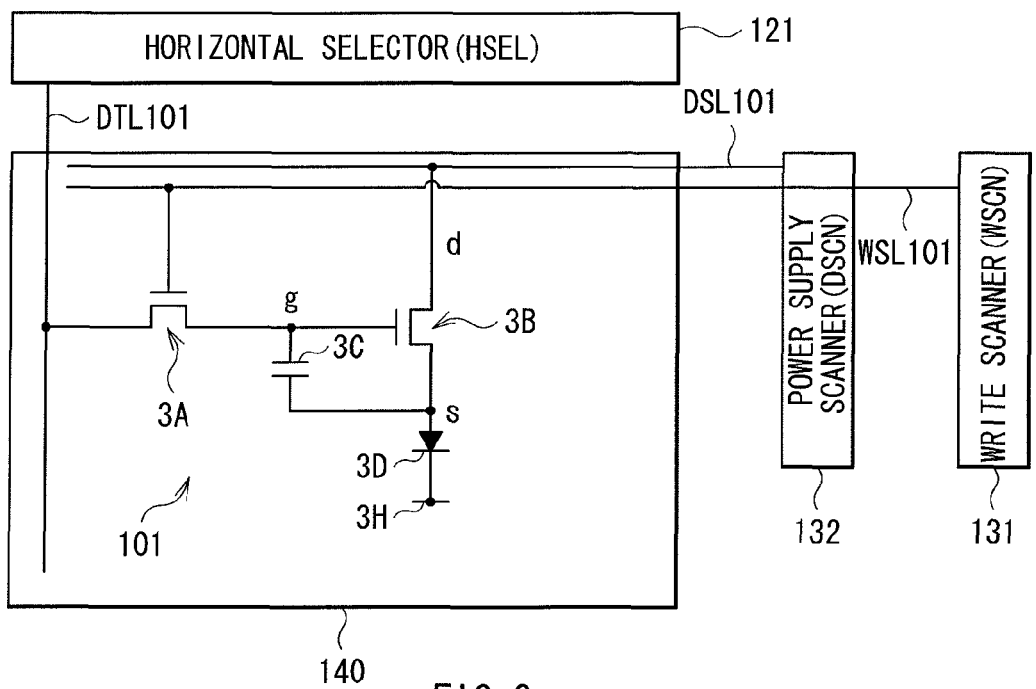
FIG. 2 An equivalent circuit diagram showing an exemplary pixel drive circuit of FIG. 1.

FIG. 2 is a diagram showing an example of the pixel circuit 140. The pixel circuit 140 is an active-type drive circuit including a sampling transistor 3A, a drive transistor 3B, a storage capacity 3C, and a light-emitting element 3D being the organic light-emitting element PXLC. In the sampling transistor 3A, a gate thereof is connected to the corresponding scan line WSL 101, either a source or a drain thereof is connected to the corresponding signal line DTL 101, and the remaining is connected to a gate g of the drive transistor 3B. In the drive transistor 3B, a drain d thereof is connected to the corresponding power supply line DSL 101, and a source s thereof is connected to an anode of the light-emitting element 3D. In the light-emitting element 3D, a cathode thereof is connected to a ground wiring pattern 3H. Note here that this ground wiring pattern 3H is provided for a shared use among all of the pixels PXLC. The storage capacity 3C is connected between the source s and the gate g in the drive transistor 3B.

The sampling transistor 3A is conducted in accordance with a control signal coming from the corresponding scan line WSL 101, and is operated to sample the signal potential of a video signal provided by the corresponding signal line DTL 101 for storage into the storage capacity 3C. The drive transistor 3B is operated to, after receiving a current supply from the power supply line DSL 101 at a first potential, provide a drive current to the light-emitting element 3D in accordance with the signal potential stored in the storage capacity 3C. The light-emitting element 3D is so configured as, by the drive current provided as such, to emit light with the luminance in accordance with the signal potential of the video signal.

Figure 3:
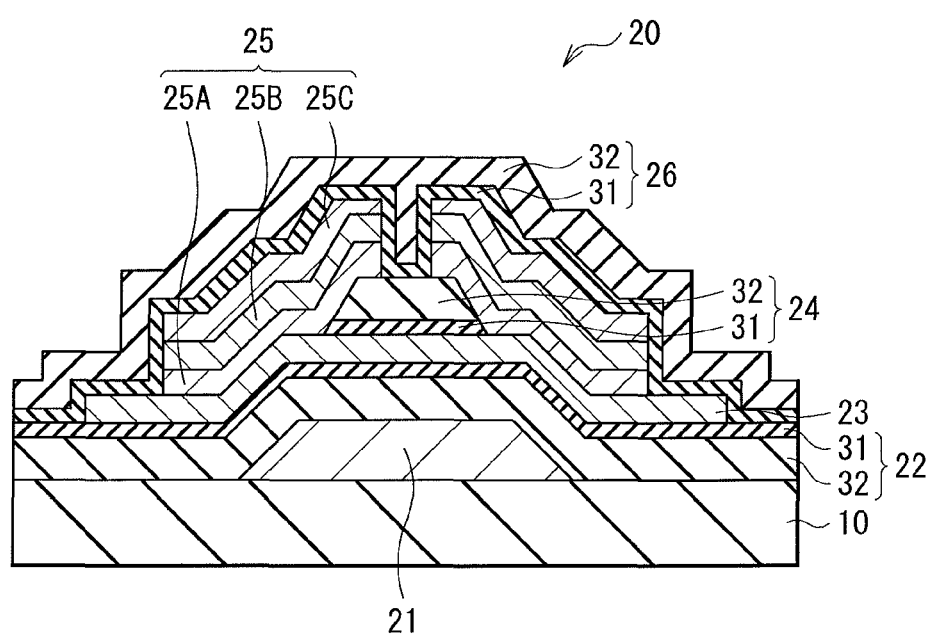
FIG. 3 A cross sectional view of a TFT of FIG. 2, showing the configuration thereof.

FIG. 3 is a diagram showing the cross-sectional configuration of a TFT 20 configuring the sampling transistor 3A and the drive transistor 3B shown in FIG. 2. The TFT 20 is an oxide semiconductor transistor including, on a substrate 10 in order, a gate electrode 21, a gate insulation film 22, an oxide semiconductor layer 23, a channel protection layer 24, a source/drain electrode 25, and a passivation film 26, for example. Herein, the oxide semiconductor means an oxide of zinc, indium, gallium, tin, or a mixture thereof, and is known to have the excellent semiconductor characteristics.

The gate electrode 21 is for controlling, by a gate voltage for application to the TFT 20, the electron density in the oxide semiconductor layer 23. The gate electrode 21 has the two-layer configuration of a molybdenum (Mo) layer with the thickness of 50 nm, and an aluminum (Al) or aluminum alloy layer with the thickness of 400 nm, for example. The aluminum alloy layer is exemplified by an aluminum-neodymium alloy layer.

The gate insulation film 22, the channel protection layer 24, and the passivation film 26 are each in the laminate configuration of a first layer 31 and a second layer 32. The first layer 31 is made of aluminum oxide, and the second layer 32 is made of an insulation material including silicon (Si). With such a configuration, in the resulting display device, the desorption of oxygen and others can be suppressed from occurring in the oxide semiconductor layer 23, and the time to be taken for formation of the gate insulation film 22, the channel protection layer 24, and the passivation film 26 can be reduced.

The first layer 31 is for stabilizing the electrical characteristics of the TFT 20 by suppressing desorption of oxygen and others from occurring in the oxide semiconductor layer 23, and by suppressing any change of the carrier concentration in the oxide semiconductor layer thanks to the excellent gas barrier resistance of the aluminum oxide.

The second layer 32 is for reducing the time to be taken for film formation of the gate insulation film 22, the channel protection layer 24, and the passivation film 26 without causing degradation of the characteristics of the TFT 20. The second layer 32 preferably includes one or more of a silicon oxide film, a silicon nitride film, and a silicon oxynitride film.

The oxide semiconductor shows a large change of the carrier concentration in the semiconductor due to the influence of oxygen and moisture content. As a result, when the TFT 20 is driven for a long time, or during the manufacturing process of the TFT 20, the TFT 20 often shows a change of electrical characteristics. In consideration thereof, by sandwiching the oxide semiconductor layer 23 between the first later 31 of the gate insulation film 22 and the first layer 31 of the channel protection layer 24, the influence of gas such as oxygen can be reduced, thereby being able to increase the stability and reliability of the electrical characteristics of the TFT 20.

The first and second layers 31 and 32 are preferably disposed one on the other so that the first layer 31 comes on the side of the oxide semiconductor layer 23. This is because such a configuration allows to sandwich the oxide semiconductor layer 23 directly between the first layer 31 of the gate insulation film 22 and the first layer 31 of the channel protection layer 24 so that the resulting effects can be enhanced thereby.

Moreover, the TFT 20 can be increased in stability and reliability to a further degree by covering the oxide semiconductor layer 23 by the first layer 31 of the passivation film 26 so that the resulting effects can be enhanced thereby.

The first layer 31 of the gate insulation film 22 preferably has the thickness of 10 nm or more but 100 nm or less, and the second layer 32 thereof preferably has the thickness of 100 nm or more but 600 nm or less, for example. The first layer 31 of the channel protection layer 24 preferably has the thickness of 10 nm or more but 100 nm or less, and the second layer 32 thereof preferably has the thickness of 100 nm or more but 600 nm or less, for example. The first layer 31 of the passivation film 26 preferably has the thickness of 10 nm or more but 100 nm or less, and the second layer 32 thereof preferably has the thickness of 100 nm or more but 600 nm or less, for example.

The oxide semiconductor layer 23 has the thickness of 20 nm or more but 100 nm or less, and is made of indium gallium zinc oxide (IGZO), for example.

The source/drain electrode 25 is made of a metal material such as molybdenum, aluminum, or titanium, or is configured by a multi-layer film made of such metal materials. A specific configuration of the source/drain electrode 25 preferably is a laminated film including, from the side of the oxide semiconductor layer 23, a molybdenum layer 25A with the thickness of 50 nm, an aluminum layer 25B with the thickness of 500 nm, and a titanium layer 25C with the thickness of 50 nm, for example. The reasons thereof are as below. In each of the organic light-emitting elements 10R, 10G, and 10B that will be described later, if an anode 52 is made of a metal material mainly including aluminum, a need arises to apply wet etching to these anodes 52 using a mixed solution of phosphoric acid, nitric acid, acetic acid, and others. In this case, as is very low in etching rate, the titanium layer 25C can be remained on the side of the substrate 10. As a result, this accordingly enables to connect the titanium layer 25C on the side of the substrate 10 to cathodes 55 of the organic light-emitting elements 10R, 10G, and 10B that will be described later.

Note here that, depending on the use and application of the TFT 20, the source/drain electrode 25 may be configured also by a laminated film of a molybdenum layer, an aluminum layer, and another molybdenum layer, or a laminated film of a titanium layer, an aluminum layer, and another titanium layer.

Figure 4:
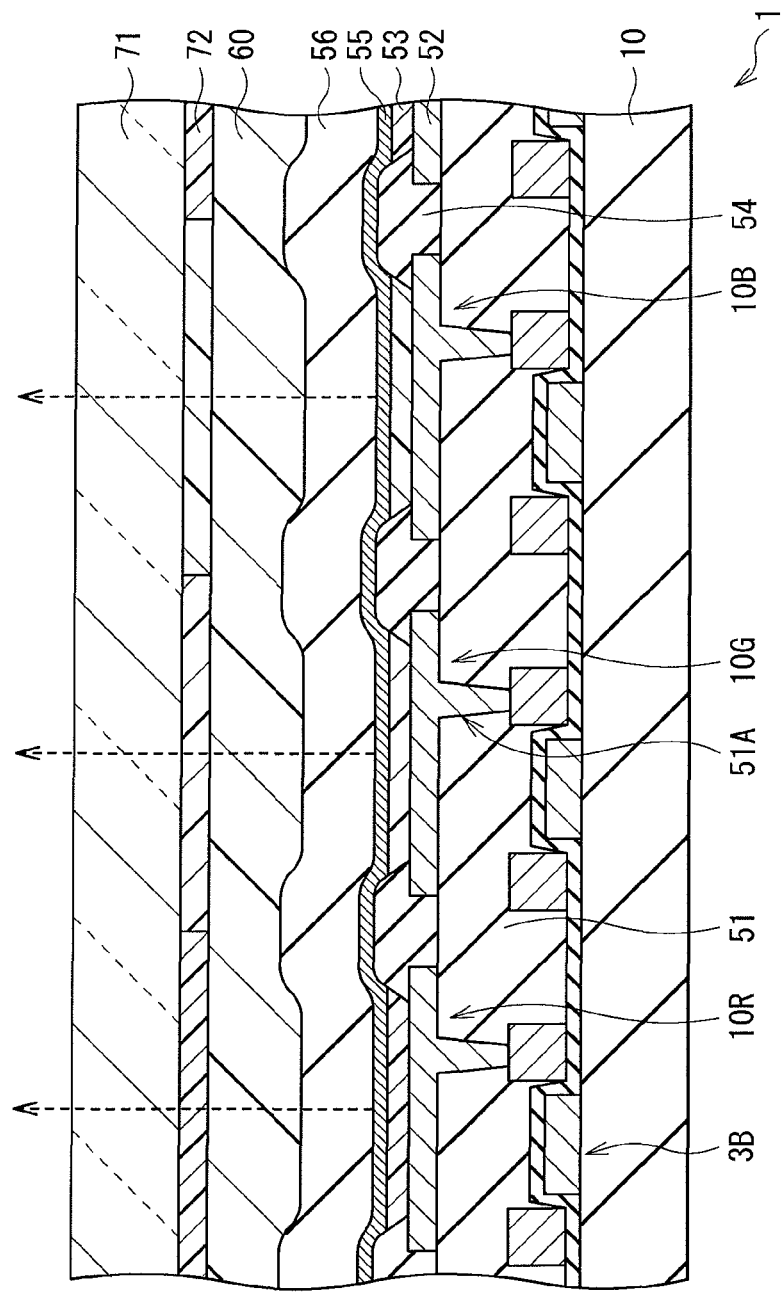
FIG. 4 A cross sectional view of a display region of FIG. 1, showing the configuration thereof.

FIG. 4 is a diagram showing the cross-sectional configuration of the display region 110. In the display region 110, the organic light-emitting elements 10R, 10G, and 10B are arranged in order altogether like a matrix. The organic light-emitting elements 10R each emit light of red, the organic light-emitting elements 10G each emit light of green, and the organic light-emitting elements 10B each emit light of blue. The organic light-emitting elements 10R, 10G, and 10B are each shaped like a strip in the planer view, and any of the adjacent organic light-emitting elements 10R, 10G, and 10B form a pixel.

The organic light-emitting elements 10R, 10G, and 10B each have the laminate configuration including, in order on the TFT substrate 1 via a flat insulation film 51, the anode 52, an electrode-to-electrode insulation film 54, an organic layer 53 including a light-emitting layer that will be described later, and the cathode 55.

Such organic light-emitting elements 10R, 10G, and 10B are each covered as required by a protection layer 56 made of silicon nitride (SiN), silicon oxide (SiO), or others. Moreover, such a protection layer 56 is affixed entirely thereover with a sealing substrate 71 via an attachment layer 60 so that it is sealed. The sealing substrate 71 is made of glass or others, and the attachment layer 60 is made of thermosetting resin, ultraviolet curable resin, or others. The sealing substrate 71 may be provided with, as required, a color filter 72, and a light shielding film (not shown) as a black matrix.

The flat insulation film 51 is for making flat the surface of the TFT substrate 1, which is formed with the pixel drive circuit 140 including the sampling transistor 3A and the drive transistor 3B constituted by the TFT 20 described above. Such a flat insulation film 51 is preferably made of a material with a good pattern accuracy because a minute connection hole 51A is formed thereon. Such a material for the flat insulation film 51 includes an organic material such as polyimide, or an inorganic material such as silicon oxide ($SiO_2$), for example. The drive transistor 3B shown in FIG. 2 is electrically connected to the anode 52 via the connection hole 51A formed to the flat insulation film 51.

The anode 52 is formed so as to correspond to each of the organic light-emitting elements 10R, 10G, and 10B. The anode 52 has a function as a reflection electrode that reflects light generated on the light-emitting layer, and configuring it to have a reflection coefficient as high as possible is desirable in view of increasing the light-emission efficiency. The anode 52 has the thickness of 100 nm or more but 1000 nm or less, for example, and is made of a metal element such as silver (Ag), aluminum (Al), chromium (Cr), titanium (Ti), iron (Fe), cobalt (Co), nickel (Ni), molybdenum (Mo), copper (Cu), tantalum (Ta), tungsten (W), platinum (Pt), gold (Au), or others, or alloys thereof.

The electrode-to-electrode insulation film 54 is for insulating the anode 52 and the cathode 55 from each other without fail, and for forming the light-emitting region in any desired shape with a good accuracy. The electrode-to-electrode insulation film 54 is made of an organic material such as polyimide, or an inorganic insulation material such as silicon oxide ($SiO_2$), for example. The electrode-to-electrode insulation film 54 has an aperture portion corresponding to the light-emitting region of the anode 52. Note that the organic layer 53 and the cathode 55 may be provided not only in the light-emitting region but also on the electrode-to-electrode insulation film 54 next to each other. However, light emission occurs only in the aperture portion of the electrode-to-electrode insulation film 54.

The organic layer 53 has the laminate configuration including, in order from the side of the anode 52, a hole injection layer, a hole transport layer, a light-emitting layer, and an electron transport layer (all not shown), for example. The layers other than the light-emitting layer may be provided as required. The organic layer 53 is not necessarily in one specific configuration, and may vary in configuration depending on the color of light emission by the organic light-emitting elements 10R, 10G, and 10B. The hole injection layer is a buffer layer being not only for increasing the efficiency of hole injection but also for preventing leakage. The hole transport layer is for increasing the efficiency of hole transport to the light-emitting layer. The light-emitting layer is for generation of light as a result of recombination between electrons and holes with the application of an electric field. The electron transport layer is for increasing the efficiency of electron transport to the light-emitting layer. Note that the organic layer 53 is not restricted in material as long as it is a general low-molecular or macromolecular organic material.

The cathode 55 has the thickness of 5 nm or more but 50 nm or less, and is made of a metal element such as aluminum (Al), magnesium (Mg), calcium (Ca), sodium (Na), or others, or alloys thereof, for example. Among all, the preferable material is alloys of magnesium and silver (MgAg alloys), or alloys of aluminum (Al) and lithium (Li) (AlLi alloys). The cathode 55 may be made of ITO (Indium Tin Complex Oxide) or IZO (Indium Zinc Complex Oxide).

This display device can be manufactured as below, for example.

(Forming Process of TFT Substrate 1)

First of all, the two-layer configuration of a molybdenum (Mo) layer with the thickness of 50 nm, and an aluminum (Al) layer or aluminum alloy layer with the thickness of 400 nm is formed by, for example, sputtering on the substrate 10 made of glass. Thereafter, to this two-layer configuration, photolithography and etching are applied so that the gate electrode 21 is formed as shown in FIG. 5(A).

Figure 5:
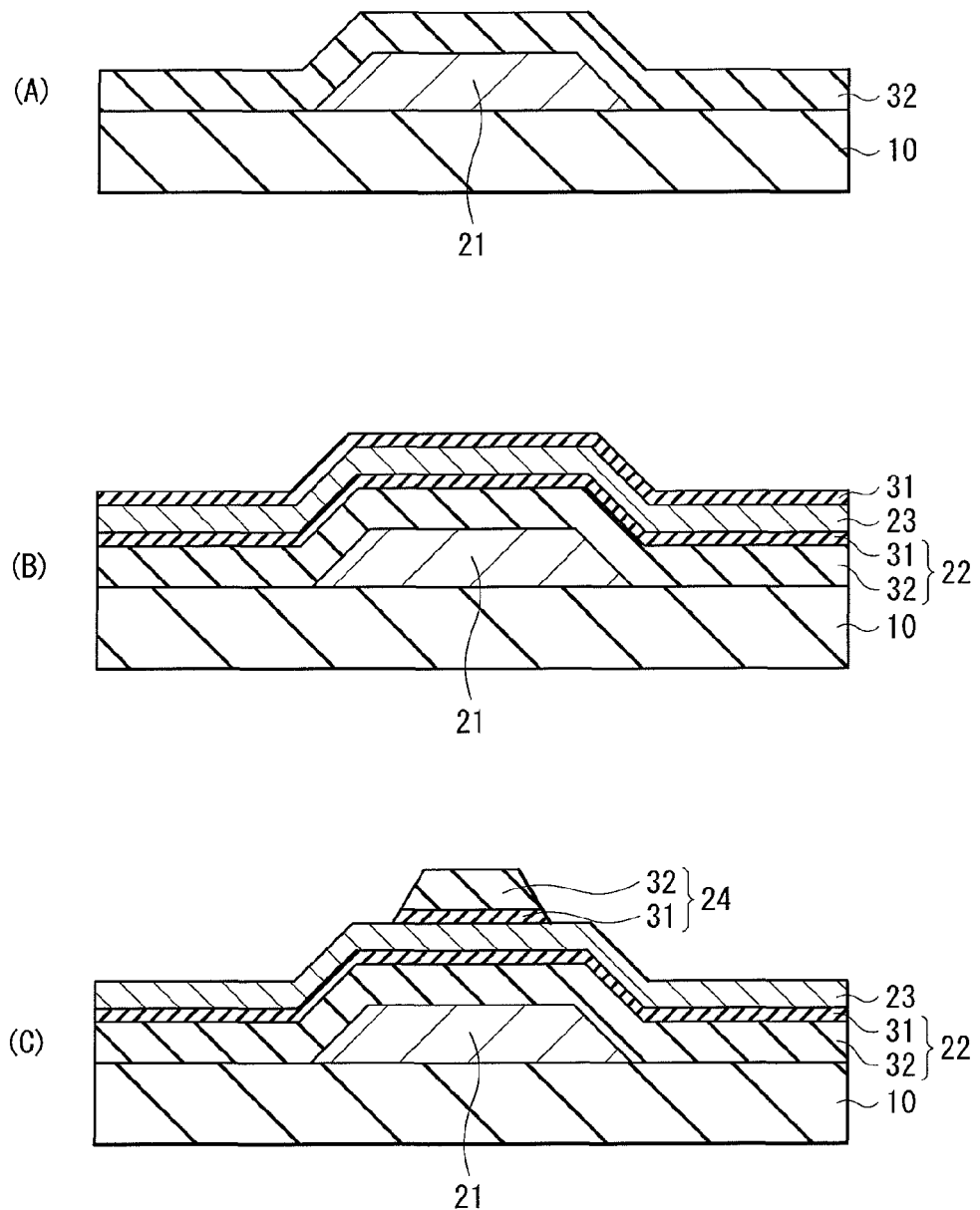
FIG. 5 Cross sectional views of the display device of FIG. 1, showing a manufacturing method thereof in order of processes.

Thereafter, also as shown in FIG. 5(A), the second layer 32 of the gate insulation film 22 made of the abode-described material with the above-described thickness is formed by, for example, plasma CVD (Chemical Vapor Deposition) on the entire surface of the substrate 10.

Next, as shown in FIG. 5(B), the first layer 31 of the gate insulation film 22 made of the abode-described material with the above-described thickness is formed by atomic layer deposition or sputtering, for example.

After the formation of the first layer 31 of the gate insulation film 22, also as shown in FIG. 5(B), the oxide semiconductor layer 23 made of the abode-described material with the above-described thickness is formed by sputtering using an oxide target such as zinc oxide, for example. At this time, when the oxide semiconductor layer 23 is made of IGZO, for example, by DC sputtering with a target of IGZO ceramics, the oxide semiconductor layer 23 is formed on the substrate 10 by plasma discharge with a gas mixture of argon (Ar) and oxygen ($O_2$). Note here that, before the plasma discharge, the vacuum vessel is subjected to air exhaust until the degree of vacuum therein reaches $1 \times 10^{-4}$ Pa or lower, and then a gas mixture of argon and oxygen is directed thereinto. Moreover, when the oxide semiconductor layer 23 is made of zinc oxide, for example, the oxide semiconductor layer 23 is formed by RF sputtering with a target of zinc oxide ceramics, or by DC sputtering in the gas atmosphere including argon and oxygen using a metal target of zinc.

After the formation of the oxide semiconductor layer 23, also as shown in FIG. 5(B), the first layer 31 of the channel protection layer 24 made of the above-described material with the above-described thickness is formed by atomic layer deposition or by sputtering, for example.

At this time, the first layer 31 of the gate insulation film 22, the oxide semiconductor layer 23, and the first layer 31 of the channel protection layer 24 is preferably formed continuously by sputtering. If this is the case, the oxide semiconductor layer 23 can be formed in the vacuum with no exposure to the air so that, on the contact interface between the oxide semiconductor layer 23 and the first layer 31 of the gate insulation film 22, and on the contact interface between the oxide semiconductor layer 23 and the first layer 31 of the channel protection layer 24, the resulting interfaces can be favorable with fewer defects and a low fixed electric charge. This thus leads to the favorable transistor characteristics and reliability.

After the formation of the first layer 31 of the channel protection layer 24, as shown in FIG. 5(C), the second layer 32 of the channel protection 24 made of the above-described material with the above-described thickness is formed by CVD, for example. The first and second layers 31 and 32 of the channel protection layer 24 are then each formed in a predetermined shape by photolithography and etching.

Figure 6:
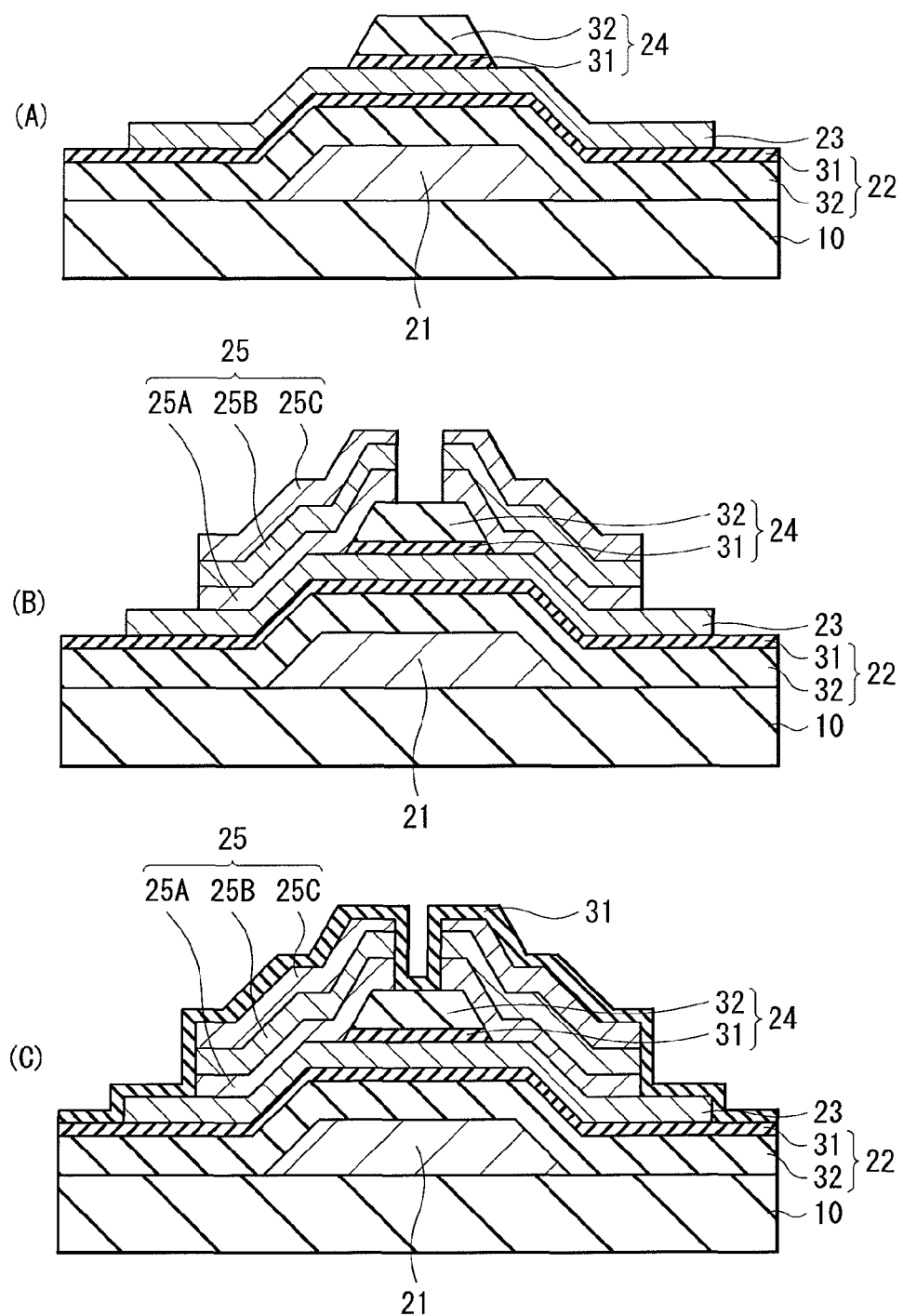
FIG. 6 Cross sectional views thereof showing processes subsequent to those of FIG. 5.

Thereafter, as shown in FIG. 6(A), the oxide semiconductor layer 23 is formed in a predetermined shape by photolithography and etching.

Thereafter, by sputtering, for example, the titanium layer 25A is formed with the thickness of 50 nm, the aluminum layer 25B is formed with the thickness of 500 nm, and the molybdenum layer 25C is formed with the thickness of 50 nm. These layers are then each formed in a predetermined shape by photolithography and etching. At this time, for example, by wet etching using a mixed solution of phosphoric acid, nitric acid, and acetic acid, for example, the molybdenum layer 25C and the aluminum layer 25B are subjected to etching, and then by dry etching using chlorine gas, the titanium layer 25A is subjected to etching. In this manner, as shown in FIG. 6(B), the source/drain electrode 25 is formed.

After the formation of the source/drain electrode 25, as shown in FIG. 6(C), the first layer 31 of the passivation film 26 made of the above-described material with the above-described thickness is formed by atomic layer deposition or sputtering, for example. When a method in use is atomic layer deposition, trimethylaluminum gas for use as raw material gas is introduced into the vacuum chamber, and an aluminum film being an atomic layer is formed on the surface of the substrate 10. Thereafter, oxygen radical is introduced to the surface of the substrate 10 so that the aluminum film is oxidized. The oxygen radical is the result of exciting ozone gas or oxygen gas by plasma. The aluminum film formed for the first time has the thickness of the atomic layer, and thus is easily oxidized by ozone or oxygen radical. A uniform aluminum oxide film can be formed on the entire surface of the substrate 10. Thereafter, by repeating a process of forming the aluminum film and a process of oxidation, the first layer 31 can be formed with the aluminum oxide film with a desired thickness. With this method, without causing a shortage of the oxygen concentration in the aluminum oxide film, the resulting composition can be at a stoichiometric ratio. As such, the composition ratio between aluminum and oxygen can be ideally 2:3 so that the resulting first layer 31 can have the excellent electrical characteristics and the excellent gas barrier resistance. Moreover, by using the method of atomic layer deposition, the first layer 31 made of aluminum oxide can be formed dense with control over the generation of hydrogen that degrades the electrical characteristics of the oxide semiconductor layer 23.

Thereafter, by CVD, for example, the second layer 32 of the passivation film 26 made of the above-described material with the above-described thickness is formed. As such, formed is the TFT substrate 1 including the TFT 20 of FIG. 3.
(Forming Process of Organic Light-Emitting Elements 10R, 10G, and 10B)

First of all, the TFT substrate 1 is coated entirely thereover with a photoresist, and then is exposed to light and is developed, thereby forming and baking the flat insulation film 51 and the connection hole 51A. Thereafter, by direct-current sputtering, for example, the anode 52 made of the above-described material is formed, and then is selectively subjected to etching using the technology of lithography, for example, thereby being patterned into a predetermined shape. Thereafter, the electrode-to-electrode insulation film 54 made of the above-described material with the above-described thickness is formed by CVD, for example, and then an aperture portion is formed using the technology of lithography, for example. Thereafter, by vapor deposition, for example, the organic layer 53 and the cathode 55 each made of the above-described material are formed in order, and the organic light-emitting elements 10R, 10G, and 10B are then formed. The resulting organic light-emitting elements 10R, 10G, and 10B are then covered by the protection film 56 made of the above-described material.

Thereafter, on the protection film 56, the attachment layer 60 is formed. The color filter 72 is then provided, and the sealing substrate 71 made of the above-described material is prepared. The TFT substrate 1 and the sealing substrate 71 are then affixed together with the attachment layer 60 disposed therebetween. In such a manner, the display device shown in FIG. 4 is completed.

In this display device, the sampling transistor 3A is conducted in accordance with a control signal each coming from the scan lines WSL, and a video signal each coming from the signal lines DTL are sampled in terms of its signal potential for storage in the storage capacity 3C. Also, the drive transistor 3B is provided with a current from any of the power supply lines DSL at a first potential, and in accordance with the signal potential stored in the storage capacity 3C, a drive current is provided to the light-emitting elements 3D (organic light-emitting elements 10R, 10G, and 10B). The light-emitting elements 3D (organic light-emitting elements 10R, 10G, and 10B) emit light, by the drive current provided as such, with the luminance in accordance with the signal potential of the video signals. This light is extracted after the passage through the cathode 55, the color filter 72, and the sealing substrate 71.

In this example, the gate insulation film 22, the channel protection layer 24, and the passivation film 26 each have the laminate configuration including the first layer 31 made of aluminum oxide, and the second layer 32 made of an insulation material including silicon (Si). In the resulting configuration, the oxide semiconductor layer 23 is sandwiched on both sides by the first layer 31 made of aluminum oxide. Thus, the desorption of oxygen and others can be suppressed from occurring in the oxide semiconductor layer 23 so that the threshold voltage is stabilized in the TFT 20, and the off current is suppressed from increasing. Therefore, the leakage current is reduced in the TFT 20, whereby the resulting display can be luminous with a high level of luminance. Moreover, since the second layer 32 is made of an insulation material including silicon (Si), compared with a previous gate insulation layer being a single layer of aluminum oxide, the time to be taken for film formation can be shorter.

Furthermore, since the characteristics of the TFT 20 can be uniform, the resulting display quality can be uniform with no roughness. In addition thereto, the TFT 20 can be increased in reliability even if it is driven for a long time.

As such, in this embodiment, the gate insulation film 22, the channel protection layer 24, and the passivation film 26 each have the laminate configuration including the first layer 31 made of aluminum oxide, and the second layer 32 made of an insulation material including silicon (Si). In the resulting configuration, the oxide semiconductor layer 23 can be sandwiched on both sides by the first layer 31 made of aluminum oxide. Therefore, the desorption of oxygen and others can be suppressed from occurring in the oxide semiconductor layer 23 so that the electrical characteristics of the TFT 20 can be stabilized. Moreover, by configuring the second layer 32 using an insulation material including silicon (Si), compared with a previous gate insulation layer being a single layer of aluminum oxide, the time to be taken for film formation can be shorter.

Especially, the first and second layers 31 and 32 are disposed one on the other so that the first layer 31 comes on the side of the oxide semiconductor layer 23. This thus allows to sandwich the oxide semiconductor layer 23 directly between the first layer 31 of the gate insulation film 22 and the first layer 31 of the channel protection layer 24 so that the resulting effects can be enhanced more thereby.

Also especially, the gate insulation film 22, the channel protection layer 24, and the passivation film 26 each have the laminate configuration including the first layer 31 made of aluminum oxide, and the second layer 32 made of an insulation material including silicon (Si). This allows to sandwich the oxide semiconductor layer 23 between the first layer 31 of the gate insulation film 22 and the first layer 31 of the channel protection layer 24, and also to cover it by the first layer 31 of the passivation film 26. Accordingly, the TFT 20 can be increased more in stability and reliability to a further degree so that the resulting effects can be enhanced more thereby.

MODIFIED EXAMPLE 1

Figure 7:
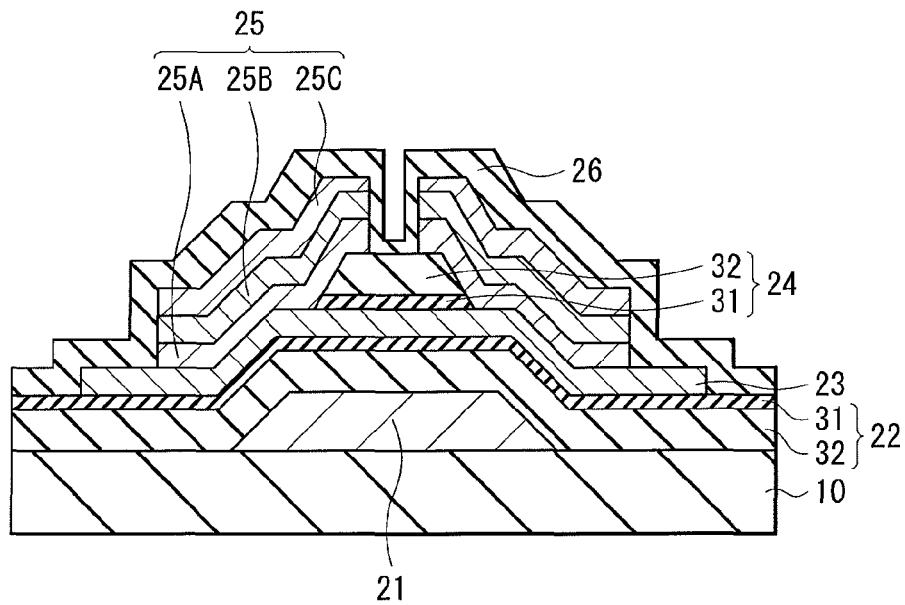
FIG. 7 A cross sectional view of a TFT in a modified example 1, showing the configuration thereof.

Note that, in the first embodiment described above, exemplified is the case in which the gate insulation film 22, the channel protection layer 24, and the passivation film 26 each have the laminate configuration including the first layer 31 made of aluminum oxide, and the second layer 32 made of an insulation material including silicon (Si). Alternatively, as shown in FIG. 7, only the gate insulation film 22 and the channel protection layer 24 may each have the laminate configuration including the first layer 31 made of aluminum oxide, and the second layer 32 made of an insulation material including silicon (Si). This configuration also enables to reduce the influence of gas such as oxygen by sandwiching the oxide semiconductor layer 23 between the first layer 31 of the gate insulation film 22 and the first layer 31 of the channel protection layer 24, thereby being able to increase the stability and reliability of the electrical characteristics of the TFT 20.

In this case, the passivation film 26 has the thickness of about 300 nm, for example, and is configured by one or more of an aluminum oxide film, a silicon oxide film, a silicon nitride film, and a silicon oxynitride film.

MODIFIED EXAMPLE 2

Figure 8:
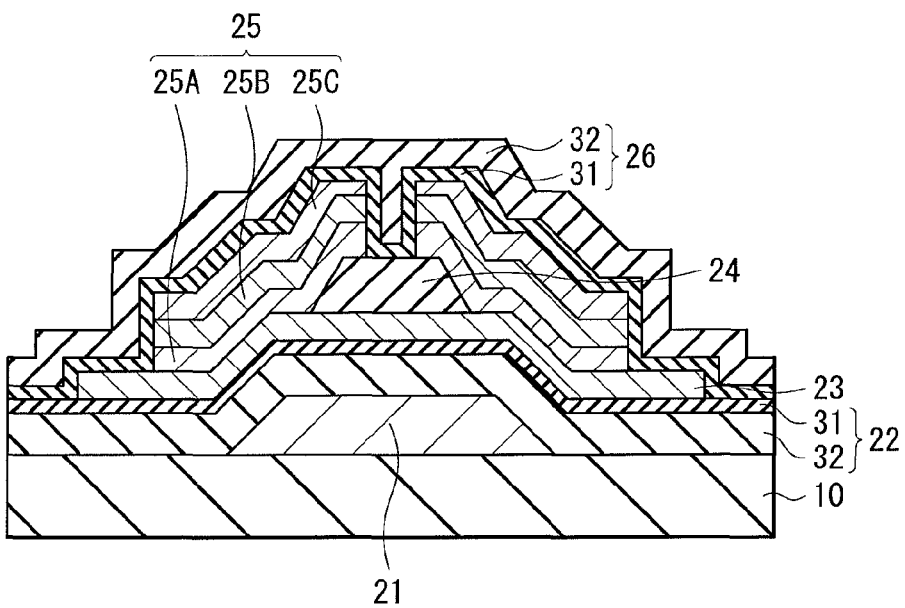
FIG. 8 A cross sectional view of a TFT in a modified example 2, showing the configuration thereof.

Still alternatively, as shown in FIG. 8, only the gate insulation film 22 and the passivation film 26 may each have the laminate configuration including the first layer 31 made of aluminum oxide and the second layer 32 made of an insulation material including silicon (Si). This configuration also enables to reduce the influence of gas such as oxygen by sandwiching the oxide semiconductor layer 23 between the first layer 31 of the gate insulation film 22 and the first layer 31 of the passivation film 26, thereby being able to increase the stability and reliability of the electrical characteristics of the TFT 20.

In this case, the channel protection layer 24 has the thickness of about 300 nm, for example, and is configured by one or more of an aluminum oxide film, a silicon oxide film, a silicon nitride film, and a silicon oxynitride film.

MODIFIED EXAMPLE 3

Figure 9:
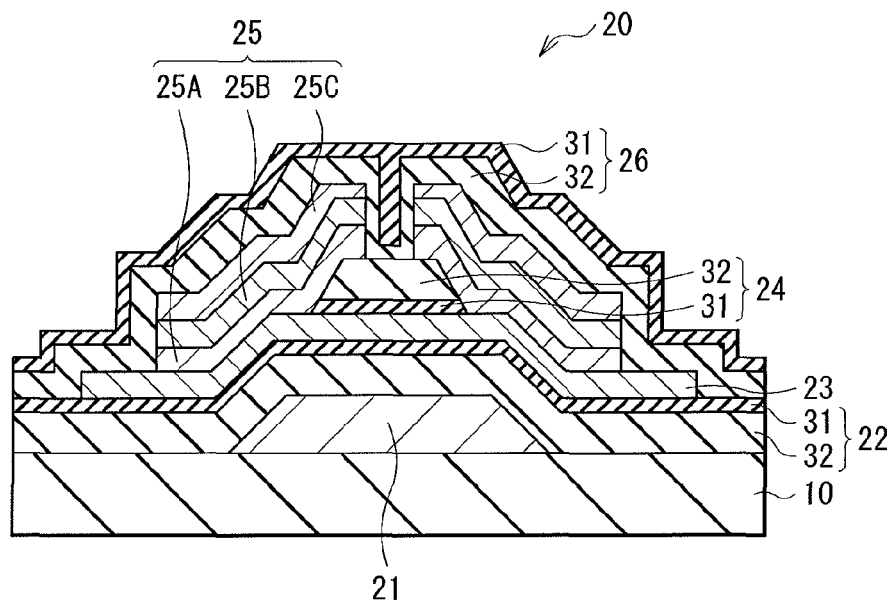
FIG. 9 A cross sectional view of a TFT in a modified example 3, showing the configuration thereof.

Note that, in the embodiment described above, exemplified is the case in which the first and second layers 31 and 32 of the passivation film 26 are disposed one on the other so that the first layer 31 comes on the side of the oxide semiconductor layer 23. Alternatively, as shown in FIG. 9, such layer disposition may be performed so that the second layer 32 comes on the side of the oxide semiconductor layer 23. Also in the gate insulation film 22 and the channel protection layer 24, the first layer 31 and the second layer 32 may be disposed one on the other so that the second layer 32 comes on the side of the oxide semiconductor layer 23.

(Second Embodiment)

Figure 10:
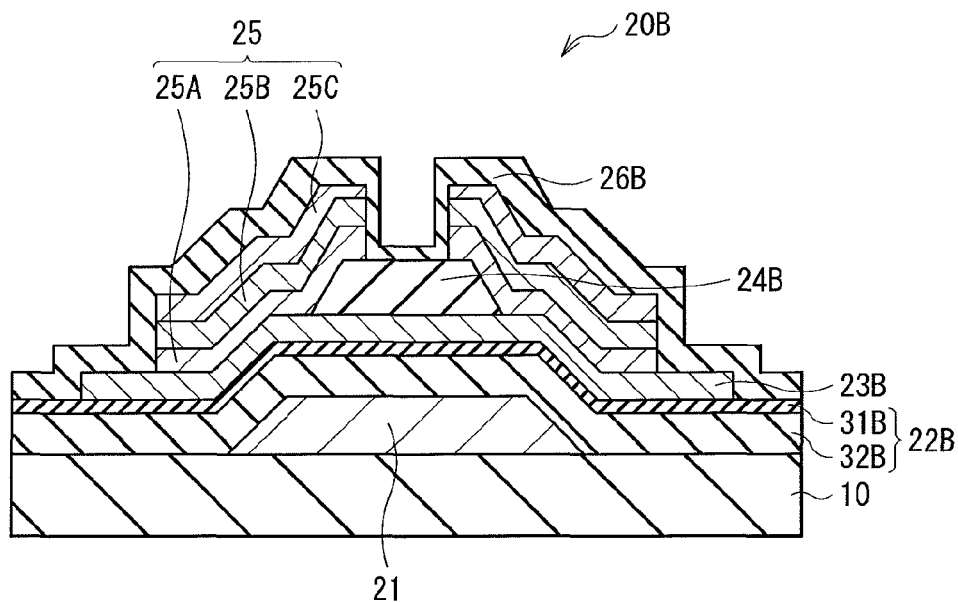
FIG. 10 A cross sectional view of a TFT in a second embodiment of the invention, showing the configuration thereof.

FIG. 10 is a diagram showing the cross-sectional configuration of a thin film transistor (TFT) 20B in a second embodiment of the invention. In this TFT 20B, a passivation film 26B is configured differently but the remaining configuration is similar to that of the TFT 20 in the first embodiment described above. Therefore, any corresponding configuration component is provided with the same reference numeral for a description.

The substrate 10, the gate electrode 21, and the source/drain element 25 are configured similarly to those in the first embodiment.

A gate insulation film 22B is formed by an insulation film being one or more types of a silicon oxide film, a silicon nitride film, a silicon oxynitride film, a hafnium oxide film, an aluminum oxide film, a tantalum oxide film, and a zirconium oxide film, or oxynitride films thereof. Moreover, if the gate insulation film 22B is in the laminate configuration of insulation films 31B and 32B including two or more types of those, the characteristics of the interface with an oxide semiconductor layer 23B can be enhanced, and any impurity included in the substrate 10 is prevented from diffusing to the oxide semiconductor layer 23B.

Similarly to the first embodiment, the oxide semiconductor layer 23B may be made of indium gallium zinc oxide (IGZO), or may additionally contain an element of tin (Sn), titanium, or others. The oxide semiconductor layer 23B has the thickness in a range of about 20 nm to 100 nm, for example.

A channel protection layer 24B is formed by an insulation film being one or more types of a silicon oxide film, a silicon nitride film, a silicon oxynitride film, a hafnium oxide film, an aluminum oxide film, a tantalum oxide film, and a zirconium oxide film, or oxynitride films thereof.

The passivation film 26B is made of an oxide, nitride, or oxynitride containing one or more of aluminum (Al), titanium (Ti), and tantalum (Ta). With such a configuration, in the TFT 20B, reduction of oxygen and others due to the hydrogen in the air does not occur in the oxide semiconductor layer, and desorption of oxygen and others can be also suppressed in the oxide semiconductor layer.

Among all, the passivation film 26B is preferably made of aluminum oxynitride or aluminum nitride. This is because the resulting effects can be enhanced thereby.

The passivation film 26B preferably has the density of 3.0 g/cm$^3$ or higher but 4.0 g/cm$^3$ or lower. This is because the barrier capabilities can be enhanced thereby to prevent the reduction of an oxide semiconductor in the manufacturing process or by hydrogen in the air, and to prevent the desorption of oxygen in the oxide semiconductor due to a heat treatment. The passivation film with a higher density generally serves better as a protection film because it does not allow the oxygen and hydrogen to pass therethrough that much. For information, the ideal bulk density of aluminum oxide ($Al_2O_3$) is 4.0 g/cm$^3$.

The passivation film 26B is a single-layer film, for example. The thickness of the passivation film 26B is preferably 10 nm or more but 1000 nm or less, and specifically about 50 nm, for example.

The TFT 20B can be manufactured as below.

Figure 11:
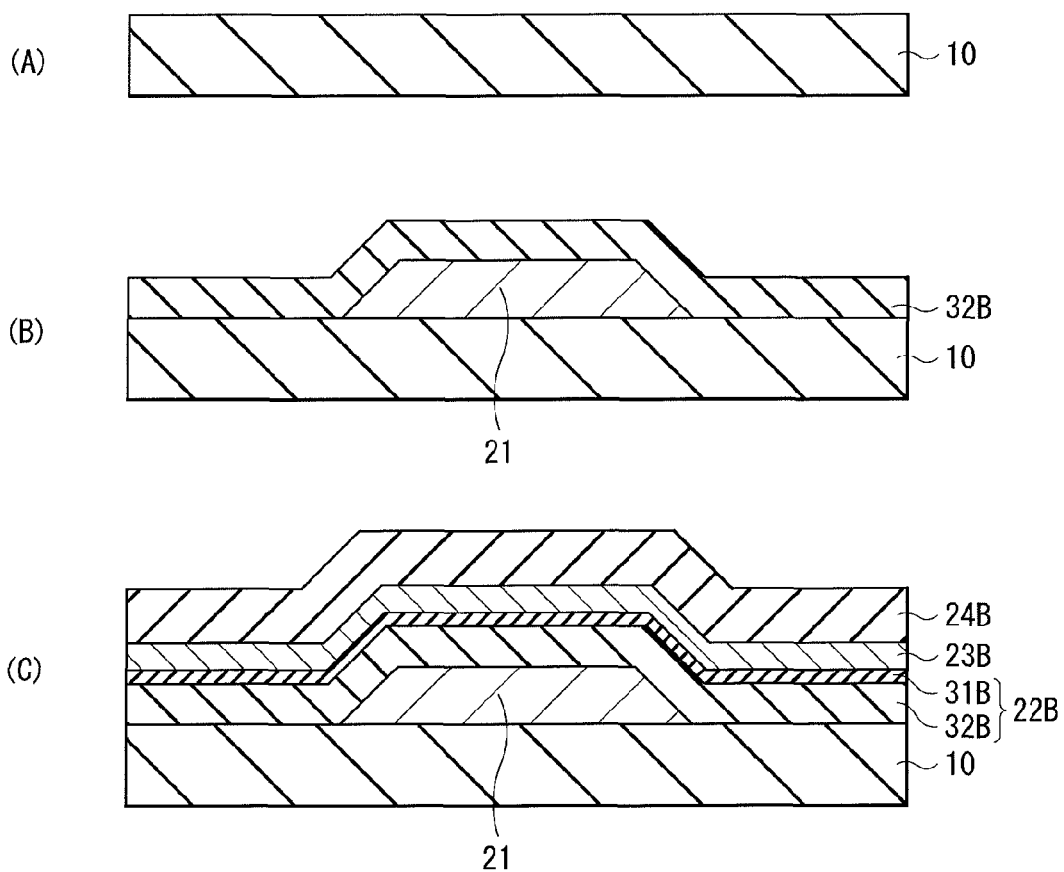
FIG. 11 Cross sectional views of the TFT of FIG. 10, showing a manufacturing method thereof in order of processes.
Figure 12:
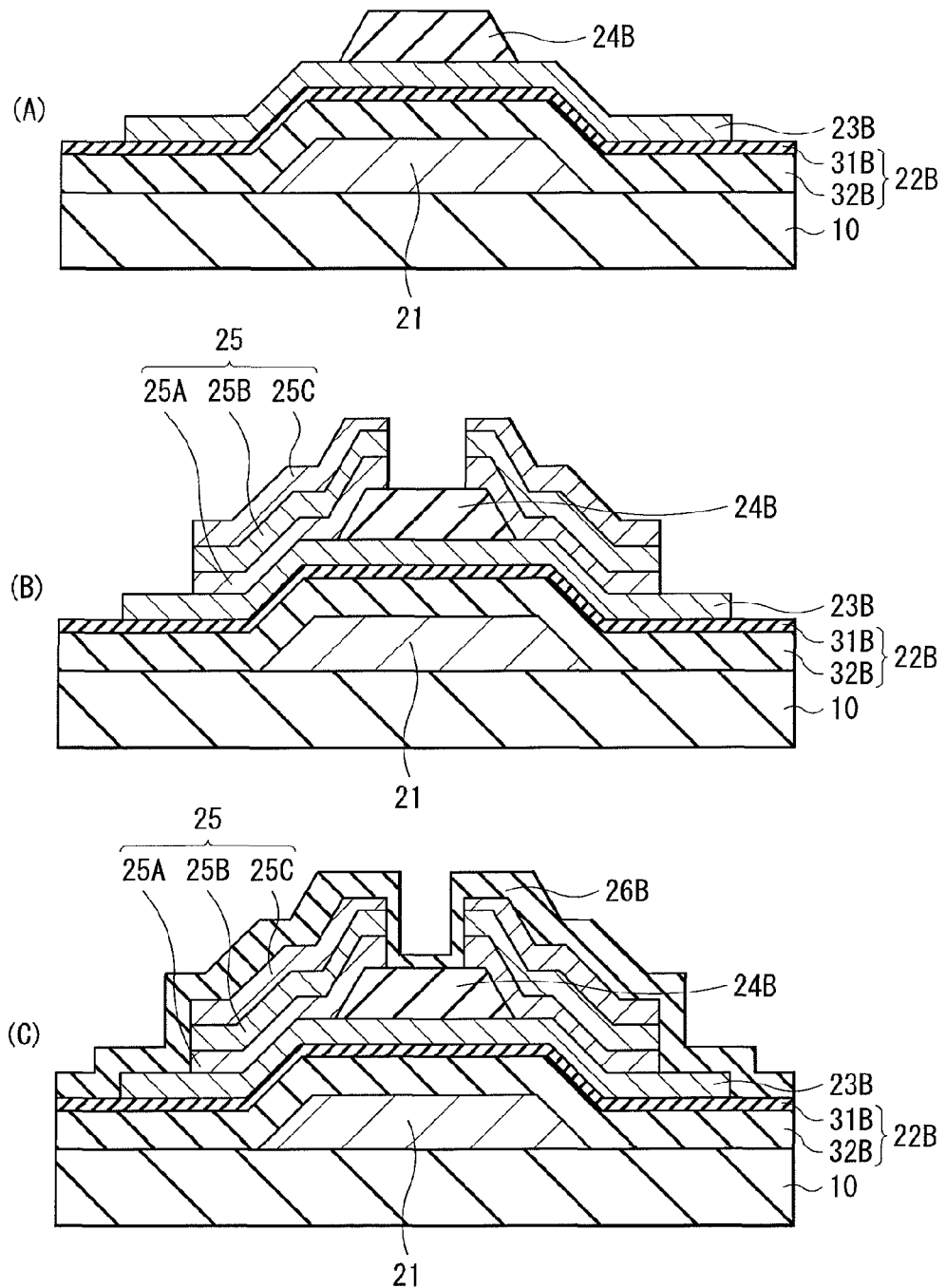
FIG. 12 Cross sectional views thereof showing processes subsequent to those of FIG. 11.

FIGS. 11 and 12 are each a diagram showing the manufacturing method of the TFT 20B in order of processes. First of all, as shown in FIG. 11(A), the substrate 10 similar to that in the first embodiment described above is prepared. The gate electrode 21 made of the above-described material is then formed on the substrate 10 by sputtering or CVD as shown in FIG. 11(B), for example.

Next, also as shown in FIG. 11(B), the film 32B of the gate insulation film 22B made of the above-described material is formed on the entire surface of the substrate 10 and the gate electrode 21.

Thereafter, as shown in FIG. 11(C), the film 31B of the gate insulation film 22B, the oxide semiconductor layer 23B, and the channel protection layer 24B each made of the above-described material with the above-described thickness are formed in order on the film 32B of the gate insulation film 22B. When the oxide semiconductor film 23B is made of indium gallium zinc oxide (IGZO), by using the method of DC sputtering with a target of indium gallium zinc oxide ceramics, an oxide semiconductor is formed on the substrate 10 by plasma discharge using a gas mixture of argon (Ar) and oxygen ($O_2$). Herein, before plasma discharge, the vacuum vessel is subjected to air exhaust until the degree of vacuum therein reaches $1 \times 10^{-4}$ Pa or lower, and then the gas mixture of argon and oxygen is introduced thereinto. When the oxide semiconductor layer 23B is made of zinc oxide, for example, a zinc oxide film can be formed for use as the oxide semiconductor layer 23 by RF sputtering with a target of zinc oxide ceramics, or by DC sputtering in the gas atmosphere including argon and oxygen using a metal target of zinc.

Thereafter, as shown in FIG. 12(A), the channel protection layer 24B is subjected to patterning by photolithography and etching, for example, to form it into a predetermined shape.

After the patterning of the channel protection layer 24B, by sputtering, for example, the titanium layer 25A, the aluminum layer 25B, and the titanium layer 25C are formed in this order with the thicknesses of about 50 nm, 500 nm, and 50 nm, respectively. Thereafter, by dry etching using chlorine gas, the titanium layer 25A, the aluminum layer 25B, and the titanium layer 25C are subjected to patterning so that, as shown in FIG. 12(B), the source/drain electrode 25 is formed. Note here that the source/drain electrode 25 can be a laminated film of molybdenum and aluminum for application to a thin-film transistor for use to drive a liquid crystal panel, for example.

After the formation of the source/drain electrode 25, as shown in FIG. 12(C), the passivation film 26B made of the above-described material with the above-described thickness is formed. The passivation film 26B is preferably formed by sputtering. The reasons thereof are described in the below.

The stoichiometric aluminum oxide is reported as having the film density of about 3.5 g/cm$^3$ to 4 g/cm$^3$, and an aluminum oxide film realizes the favorable reliability if it is formed by ALD (atomic layer deposition), which is considered as an ideal method of thin-film formation. However, this has problems of the slow throughput in mass production because too much time for film formation, and the need for use of an organic metal of aluminum, for example.

On the other hand, the method of sputtering allows to reduce the time to be taken for film formation but at the same time, the resulting formed aluminum oxide film is not reliable enough as the ALD-formed aluminum oxide due to a large number of oxygen defects therein. In consideration thereof, during the film formation of the aluminum oxide film (the passivation film 26B), making an addition of nitrogen gas is considered preferable. As such, the oxygen defects are compensated by nitrogen so that the passivation film 26B can be formed dense with a higher density. As specific requirements for the addition of nitrogen gas, for example, an addition of 0.1 to 70% of nitrogen or ammonia ($NH_3$) gas is preferable with respect to the entire pressure of 0.1 to 5 Pa.

Figure 13:
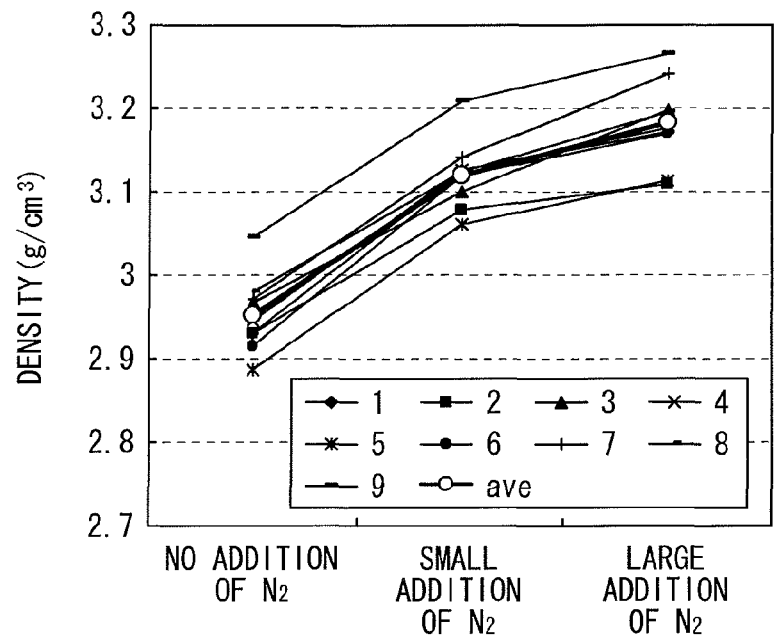
FIG. 13 A diagram showing the study results about a correlation between an addition of nitrogen and the density of a passivation film.

FIG. 13 is a diagram showing the study results about a correlation between the addition amount of nitrogen and the density of aluminum oxide/nitride, and shows the results of nine samples and the average thereof for cases of no addition of nitrogen, a small addition amount of nitrogen, and a large addition amount of nitrogen. As is known from FIG. 13, the addition of nitrogen increases the density of the aluminum oxide/nitride film by about 0.2 g/cm$^3$. Moreover, increasing the concentration of nitrogen for addition can increase the density to a further degree.

This TFT 20B can configure a display device similarly to that in the first embodiment described above. The manufacturing method of the display device is the same as that in the first embodiment described above.

The display device using this TFT 20B is operated similarly to that in the first embodiment described above. In this example, the passivation film 26B in the TFT 20B is made of an oxide, nitride, or oxynitride containing one or more of aluminum (Al), titanium (Ti), and tantalum (Ta). Such a configuration suppresses hydrogen from reaching the oxide semiconductor layer 23B so that the reduction of oxygen due to the hydrogen in the air does not occur in the oxide semiconductor layer 23B. Moreover, the desorption of oxygen and others does not occur either in the oxide semiconductor layer 23B so that the threshold voltage is stabilized in the resulting TFT 20B, and an off current is suppressed from increasing. As such, the leakage current is reduced in the TFT 20B, whereby the resulting display can be luminous with a high level of luminance. Moreover, since the characteristics of the TFT 20B can be uniform, the resulting display quality can be uniform with no roughness. In addition thereto, the TFT 20B can be increased in reliability of driving.

As such, in this embodiment, the passivation film 26B is made of an oxide, nitride, or oxynitride containing one or more of aluminum (Al), titanium (Ti), and tantalum (Ta). Such a configuration can suppress the reduction of oxygen in the oxide semiconductor layer that is caused by the hydrogen in the air, and also can suppress the desorption of oxygen and others in the oxide semiconductor layer.

(Third Embodiment)

Figure 14:
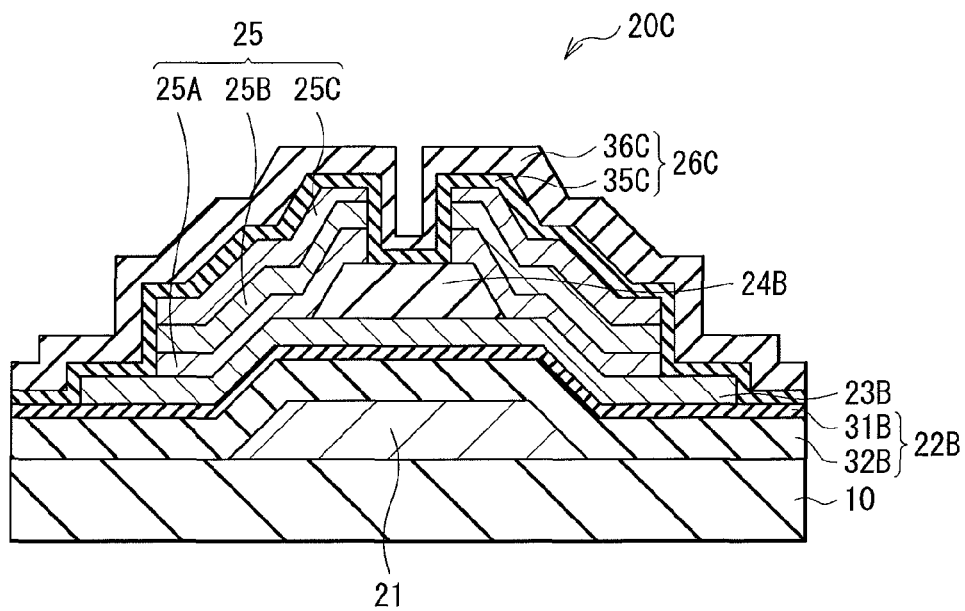
FIG. 14 A cross sectional view of a TFT in a third embodiment of the invention, showing the configuration thereof.

FIG. 14 is a diagram showing the cross-sectional configuration of a thin film transistor (TFT) 20C in a third embodiment of the invention. In this TFT 20C, a passivation film 26C is a laminated film but the remaining configuration is similar to that of the TFT 20B in the second embodiment described above, and can be manufactured similarly thereto. Therefore, any corresponding configuration component is provided with the same reference numeral for a description.

The passivation film 26C is a laminated film specifically including a lower layer 35C, and an upper layer 36C. The lower layer 35C is made of oxide including aluminum (Al), and the upper layer 36C is made of oxynitride or nitride including aluminum (Al). The reasons thereof are as below.

When the passivation film 26C is a single-layer film of the above-described oxide, the process is executed in the oxygen atmosphere during film formation by sputtering so that the desorption of oxygen is suppressed from occurring in the oxide semiconductor layer 23B, and the process can be executed with the stabilized transistor characteristics. On the other hand, when the passivation film 26C is a single-layer film of the above-described oxynitride or nitride, since an addition of nitride is made during the film formation by sputtering as described in the second embodiment, the effects of the oxygen atmosphere described above are decreased, and there thus is a possibility of degrading the transistor characteristics. With the passivation film 26C being a laminated film as described above, the lower layer 35C made of oxide including aluminum (Al) can suppress the desorption of oxygen from occurring in the oxide semiconductor layer 23B, and the upper layer 36C made of oxynitride or nitride including aluminum (Al) can suppress the passage of hydrogen.

Figure 15:
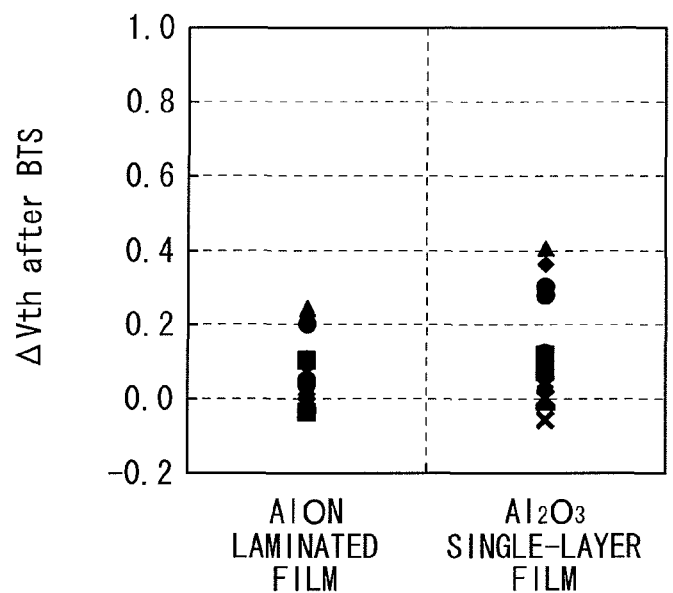
FIG. 15 A diagram showing the characteristics of a TFT when a passivation film therein is a laminated film or a single-layer film.

FIG. 15 is a diagram showing the study results about the shift amount of a threshold voltage after BTS (Bias Temperature Stress) in cases when the passivation film is a single-layer film of aluminum oxide, and when it is a laminated film of the lower layer 35B made of aluminum oxide, and the upper layer 36C of the aluminum oxynitride. As is known from FIG. 15, when the passivation film 26B is a laminated film, compared with the case when it is a single-layer film, the shift amount of a threshold voltage is smaller. In other words, with the passivation film 26B being a laminated film as described above, the threshold voltage of the resulting TFT 20C can be stabilized to a further degree so that the off current can be suppressed from increasing. Moreover, the thin film transistor can be increased in reliability of driving.

This TFT 20C can configure a display device similarly to the first and second embodiments described above. As to the display device, the manufacturing method, the advantages, and the effects thereof are the same as those in the first and second embodiments described above.

As such, in this embodiment, the passivation film 26C is a laminated film, specifically, is configured to include the lower layer 35C made of oxide including aluminum (Al), and the upper layer 36C made of oxynitride including aluminum (Al). With such a configuration, with the lower layer 35C made of oxide including aluminum (Al), the desorption of oxygen can be suppressed from occurring in the oxide semiconductor layer 23B, and with the upper layer 36C made of oxynitride including aluminum (Al), the passage of the hydrogen can be suppressed.

In the third embodiment described above, exemplified is the case that the passivation film 26C is a laminated film including the lower layer 35C made of aluminum oxide, and the upper layer 36C made of aluminum oxynitride. Alternatively, the laminated film may include an oxide film including metal and an oxynitride film made of metal other than aluminum, or may be a multi-layer of two or more layers.

(Module and Application Example)

In the below, described are application examples of the display devices described in the above embodiments. The display devices in the above embodiments can be applied for use as a display device of any electronic device in every field as long as it displays externally-provided video signals or internally-generated video signals as images or video, e.g., television devices, digital cameras, notebook personal computers, mobile terminal devices such as mobile phones, or video cameras.

(Module)

Figure 16:
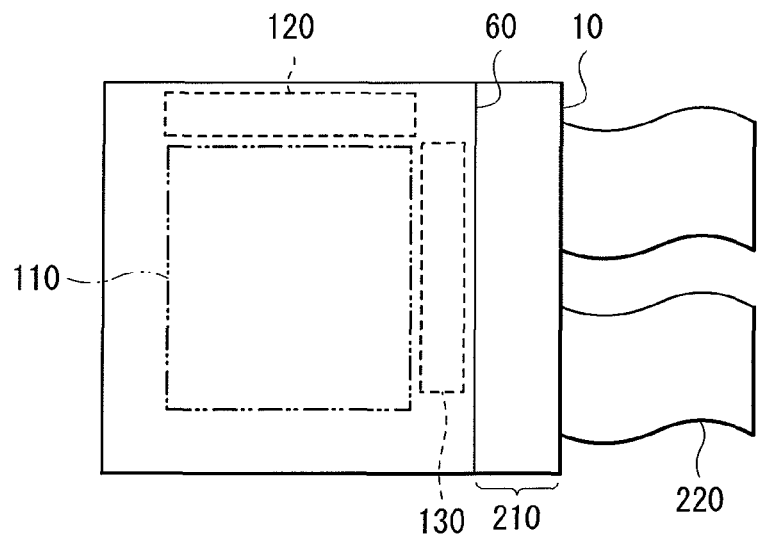
FIG. 16 A plan view of a module including the display device in the above embodiment(s), showing the schematic configuration thereof.

The display devices in the above embodiments are each incorporated, as a module shown in FIG. 16, for example, into various types of electronic devices such as application examples 1 to 5 that will be described later. In this module, for example, on one side of the substrate 10, a region 210 exposed from the sealing substrate 71 and the attachment layer 60 is provided, and this exposed region 210 is formed with an external connection terminal (not shown) by extending the wiring of a signal line drive circuit 120, and that of a scan line drive circuit 130. The external connection terminal may be provided with a flexible printed circuit (FPC) 220 for signal input/output.

APPLICATION EXAMPLE 1

Figure 17:
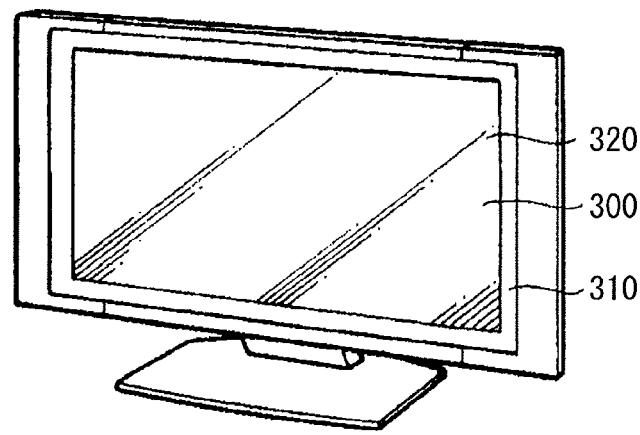
FIG. 17 A perspective view of the display device in the above embodiment(s), showing the outer view thereof in an application example 1.

FIG. 17 is a diagram showing the outer appearance of a television device to which the display devices of the above embodiments are applied. This television device is provided with a video display screen section 300 including a front panel 310 and a filter glass 320, for example. This video display screen section 300 is configured by any of the display devices of the embodiments described above.

APPLICATION EXAMPLE 2

Figure 18:
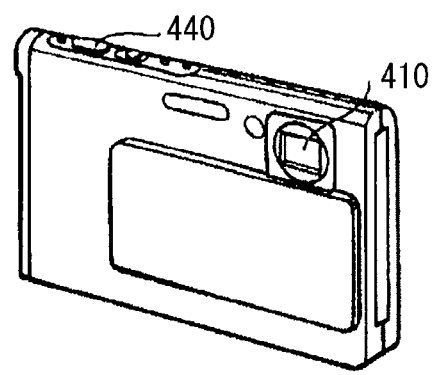
FIG. 18 (A) is a perspective external view from the front side in an application example 2, and (B) is a perspective external view from the rear side therein.
Figure 18:
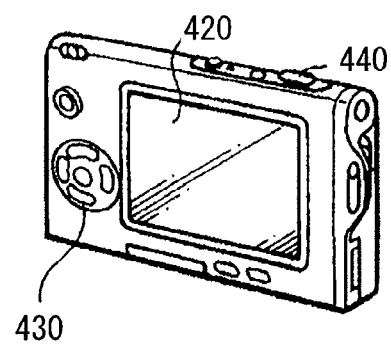

FIG. 18 is a diagram showing the outer appearance of a digital camera to which the display devices of the above embodiments are applied. This digital camera is provided with a light-emitting section 410 for flash use, a display section 420, a menu switch 430, and a shutter button 440, for example. The display section 420 is configured by any of the display devices of the embodiments described above.

APPLICATION EXAMPLE 3

Figure 19:
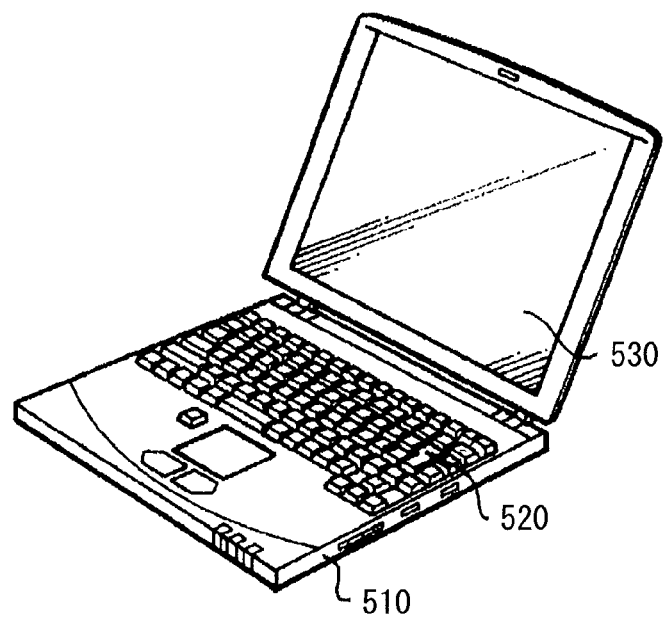
FIG. 19 A perspective external view in an application example 3.

FIG. 19 is a diagram showing the outer appearance of a notebook personal computer to which the display devices of the above embodiments are applied. This notebook personal computer is provided with a main body 510, a keyboard 520 for an input operation of text or others, and a display section 530 for display of images, for example. The display section 530 is configured by any of the display devices of the embodiments described above.

APPLICATION EXAMPLE 4

Figure 20:
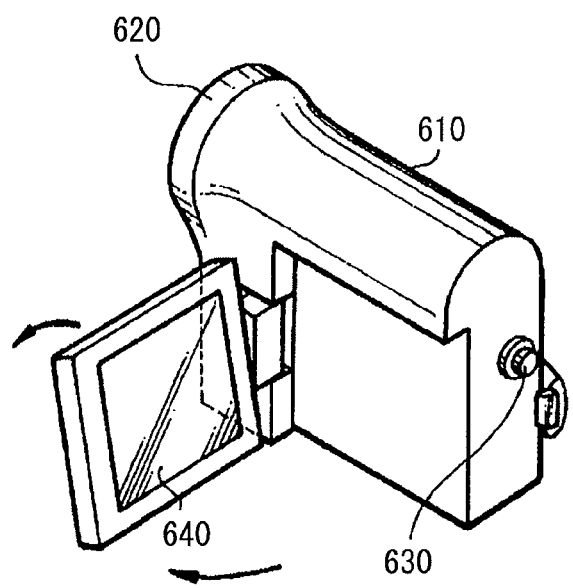
FIG. 20 A perspective external view in an application example 4.

FIG. 20 is a diagram showing the outer appearance of a video camera to which the display devices of the above embodiments are applied. This video camera is provided with a main body section 610, a lens 620 provided on the front side surface of this main body section 610 for object shooting, a start/stop switch 630 for use during shooting, and a display section 640. The display section 640 is configured by any of the display devices of the embodiments described above.

APPLICATION EXAMPLE 5

Figure 21:
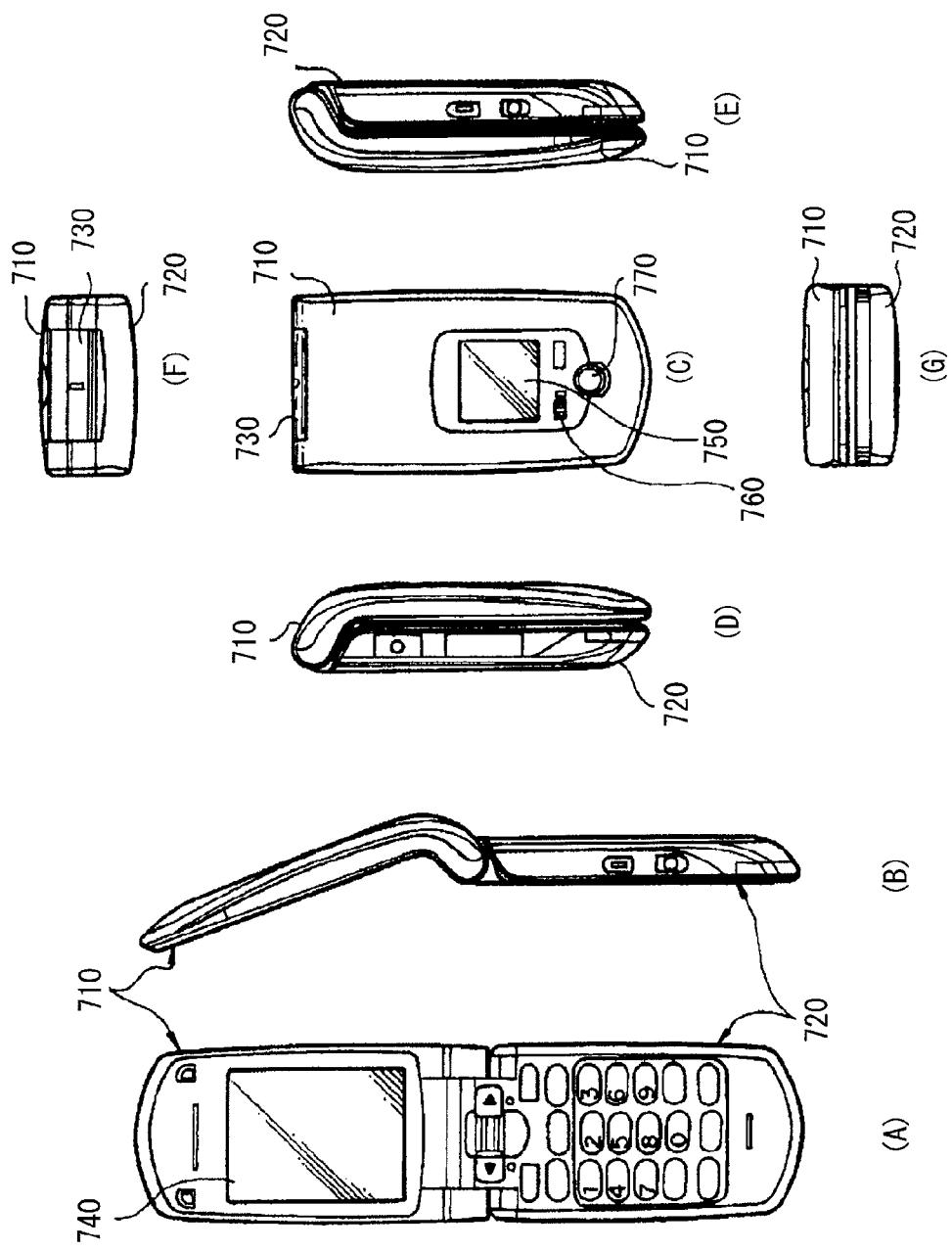
FIG. 21 (A) is a front view in the open state in an application example 5, (B) is a side view thereof, (C) is a front view in the close state, (D) is a left side view thereof, (E) is a right side view thereof, (F) is a top view thereof, and (G) is a bottom view thereof.

FIG. 21 is a diagram showing the outer appearance of a mobile phone unit to which the display devices of the above embodiments are applied. This mobile phone unit includes an upper chassis 710 and a lower chassis 720 that are coupled by a coupling section (hinge section) 730, and is provided with a display 740, a sub display 750, a picture light 760, and a camera 770, for example. The display 740 or the sub display 750 is configured by any of the display devices of the embodiments described above.

As such, while the invention has been described in detail by referring to the embodiments, the invention is not restrictive to the embodiments described above, and numerous other modifications and variations can be devised. As an example, in the first embodiment described above, exemplified is the case in which the gate insulation film 22, the channel protection layer 24, and the passivation film 26 are entirely or partially in the laminate configuration including the first layer 31 made of aluminum oxide, and the second layer 32 made of an insulation material including silicon (Si). Alternatively, separately from the gate insulation film 22, the channel protection layer 24, and the passivation film 26, on the side of the gate electrode 21 of the oxide semiconductor layer 23, and on the side opposite to the gate electrode 21, a laminated film including the first layer 31 made of aluminum oxide, and the second layer 32 made of an insulation material including silicon (Si) may be provided.

Moreover, for example, as to the layers described in the above embodiments and others, the material, the thickness, or the method of film formation, and the requirements for film formation are not all restrictive, and any other materials and thicknesses will also do, or any other methods for film formation and requirements for film formation will also do.

Further, in the above embodiments and others, the configuration of the organic light-emitting elements 10R, 10B, and 10G is specifically described, but there is no need to include every layer, or any other layers may be additionally provided.

Still further, the invention is applicable to a display device using not only such organic light-emitting elements but also any other types of display elements such as liquid crystal display elements, inorganic electroluminescent elements, display elements of electro-deposition type or electro-chromic type, or others.

The invention claimed is:

1. A thin film transistor comprising:
   a gate electrode on a substrate;
   a gate insulation film on the gate electrode;
   an oxide semiconductor layer on the gate insulation film;
   a channel protection film on the oxide semiconductor layer;
   source and drain electrodes on the channel protection film; and
   a passivation film on the source and drain electrodes,
   wherein,
      each of the gate insulation film, channel protection film, and passivation film is laminated and includes a first layer made of aluminum oxide and a second layer made of an insulation material including silicon (Si).

2. The thin film transistor according to claim 1, wherein, in the gate insulation film, the first layer and the second layer are disposed one on the other with the first layer positioned on a side of the oxide semiconductor layer.

3. The thin film transistor according to claim 1, wherein the second layer includes one or more of a silicon oxide film, a silicon nitride film, and a silicon oxynitride film.

4. A thin film transistor, comprising:
   a gate electrode on a substrate;
   a gate insulation film on the gate electrode;
   an oxide semiconductor layer on the gate insulation film;
   a channel protection film on the oxide semiconductor layer;
   source and drain electrodes on the channel protection film; and
   a passivation film on the source and drain electrodes,
   wherein,
      the passivation film is made of an oxide, nitride, or oxynitride containing one or more of aluminum (Al), titanium (Ti), and tantalum (Ta), and
      the density of the passivation film is from 3.0 g/cm$^3$ to 4.0 g/cm$^3$.

5. The thin film transistor according to claim 4, wherein the passivation film is made of aluminum oxynitride or aluminum nitride.

6. The thin film transistor according to claim 4, wherein the passivation film is a single-layer film.

7. The thin film transistor according to claim 5, wherein the passivation film is a laminated film.

8. The thin film transistor according to claim 7, wherein the laminated film includes a lower layer made of oxide including aluminum (Al), and an upper layer made of oxynitride or nitride including aluminum (Al).

9. The thin film transistor according to claim 4, wherein the passivation film is formed by sputtering.

10. A display device comprising:
    a display element; and
    a thin film transistor comprising;
       a gate electrode on a substrate,
       a gate insulation film on the gate electrode,
       an oxide semiconductor layer on the gate insulation film,
       a channel protection film on the oxide semiconductor layer,
       source and drain electrodes on the channel protection film, and
       a passivation film on the source and drain electrodes,
    wherein,
       each of the gate insulation film, channel protection film, and passivation film is laminated and includes a first layer made of aluminum oxide and a second layer made of an insulation material including silicon (Si).

11. The display device according to claim 10, wherein the display element is an organic light-emitting element including, in order from a side of the thin film transistor, an anode, an organic layer including a light-emitting layer, and a cathode.

12. A display device, comprising:
    a display element; and
    a thin film transistor comprising
       a gate electrode on a substrate,
       a gate insulation film on the gate electrode,
       an oxide semiconductor layer on the gate insulation film,
       a channel protection film on the oxide semiconductor layer,
       source and drain electrodes on the channel protection film, and
       a passivation film on the source and drain electrodes,
    wherein,
       the passivation film is made of an oxide, nitride, or oxynitride containing one or more of aluminum (Al), titanium (Ti), and tantalum (Ta), and
       the density of the passivation film is from 3.0 g/cm$^3$ to 4.0 g/cm$^3$.

13. The display device according to claim 12, wherein the display element is an organic light-emitting element including, in order from a side of the thin film transistor, an anode, an organic layer including a light-emitting layer, and a cathode.

* * * * *